United States Patent [19]

Fox

[11] 4,408,137

[45] Oct. 4, 1983

[54] BREAK-BEFORE-MAKE SOLID STATE RELAY

[75] Inventor: David A. Fox, Shawnee Township, Lima County, Ohio

[73] Assignee: Westinghouse Electric Corp., Pittsburgh, Pa.

[21] Appl. No.: 331,408

[22] Filed: Dec. 16, 1981

[51] Int. Cl.³ .................... H03K 3/295; H03K 19/21; H03K 3/42

[52] U.S. Cl. .................................. 307/598; 307/471; 307/311

[58] Field of Search .................. 307/471, 247 R, 311, 307/598; 361/98

[56] References Cited

U.S. PATENT DOCUMENTS 4,048,522 9/1977 Gary et al. ........................ 307/598
4,188,547 2/1980 Fox ..................................... 307/471

Primary Examiner—Stanley D. Miller
Assistant Examiner—B. P. Davis
Attorney, Agent, or Firm—R. P. Lenart

[57] ABSTRACT

A solid state relay is provided with a control logic circuit which receives a low level input control signal and controls at least two power field effect transistor (FET) switching elements by means of optical isolators. Break-before-make operation is accomplished by a logic circuit which momentarily turns off all FET's each time the relay is switched. Connecting an external power source to a function selecting input terminal causes the relay to operate as a normally open, normally closed, or latching relay. A voltage spike suppression network protects the FET from voltage spikes appearing across it. FET turn off time is reduced by using a Zener diode to limit maximum gate voltage.

10 Claims, 2 Drawing Figures 4,408,137

BREAK-BEFORE-MAKE SOLID STATE RELAY

BACKGROUND AND SUMMARY OF THE INVENTION

This invention relates to solid state electronic relays and more particularly to such relays utilizing photovoltaic isolators and field effect power transistors which exhibit break-before-make operation.

Solid state relays are well known for use in electrical power systems to control the energization of a load by a power source. Copending application Ser. No. 303,811, filed Sept. 21, 1981 and assigned to the present assignee discloses a solid state relay utilizing photovoltaic isolators and field effect power transistors and sets forth background material related to such relays which is herein incorporated by reference. The present invention differs from the disclosure of the copending application in that it includes provisions for break-before-make operation, means for limiting turn-off time of the field effect transistors, and changes in control logic circuitry.

Photovoltaic isolators provide a voltage output signal which can be used as the gate driving signal for a field effect transistor (FET) that serves as the switching element in a solid state relay. Due to the very small power output of these photovoltaic isolators, control of timing in the FET circuit is difficult. Typically, turn-off time can be several times longer than turn-on time. In some applications, it is desirable to produce a relay with break-before-make operation, that is, with a longer turn-on time than turn-off time.

A relay constructed in accordance with the present invention is provided with a control logic circuit which includes means for turning off at least one output pole prior to turning on at least one other pole. The control logic circuit receives a low level input control signal and controls at least two power field effect transistor switching elements by means of at least two photovoltaic optical isolators.

A plurality of operational modes are possible in a single circuit, including operation as a normally open relay, a normally closed relay, or a latched relay. A high degree of isolation is provided between the input control and power circuits by the optical isolator, while the power field effect transistor switch element provides for a low switch voltage drop.

The control logic circuit includes a voltage regulator, control input circuit, signal conditioning circuit, latching circuit and optical isolator driving circuit. Application of a positive control signal or a grounding signal to designated terminals in the control input circuit causes a change in the logic level of an exclusive OR gate output from a logic high to a logic low. This logic signal passes through a conditioning network which prevents noise from actuating the relay and provides a clean signal to the latching circuit. The latching circuit includes a flip-flop to provide the latching feature and two additional exclusive OR gates which amplify and invert the logic level control signal. The relay power supply can be connected to the flip-flop reset terminal to disable the latching feature.

The control signal passes from the latching circuit to an optical coupler driving circuit which includes transistor switches for driving light emitting diodes (LED's) in the optical coupler circuit and a logic circuit which controls the current to the LED's to ensure break-before-make operation. Each LED is contained in an optical coupler that includes an array of photovoltaic diodes which generates voltage in response to radiation from the LED's. This generated voltage is impressed on the gate of a power field effect transistor, thereby turning it on to provide the relay contact closure function. If the latching feature was not disabled, the FET will remain in the on condition even after the control input signal is removed.

The relay contact opening function is provided in a similar manner, except that the LED is turned off, thereby turning off the power FET. A voltage limiter limits maximum gate voltage to the FET's, thereby reducing turn-off time. Thus a relay in accordance with this invention exhibits a low switch voltage drop, provides for break-before-make operation and is capable of normally open, normally closed, or latched operation.

DESCRIPTION OF THE PREFERRED EMBODIMENT

Figure 1:
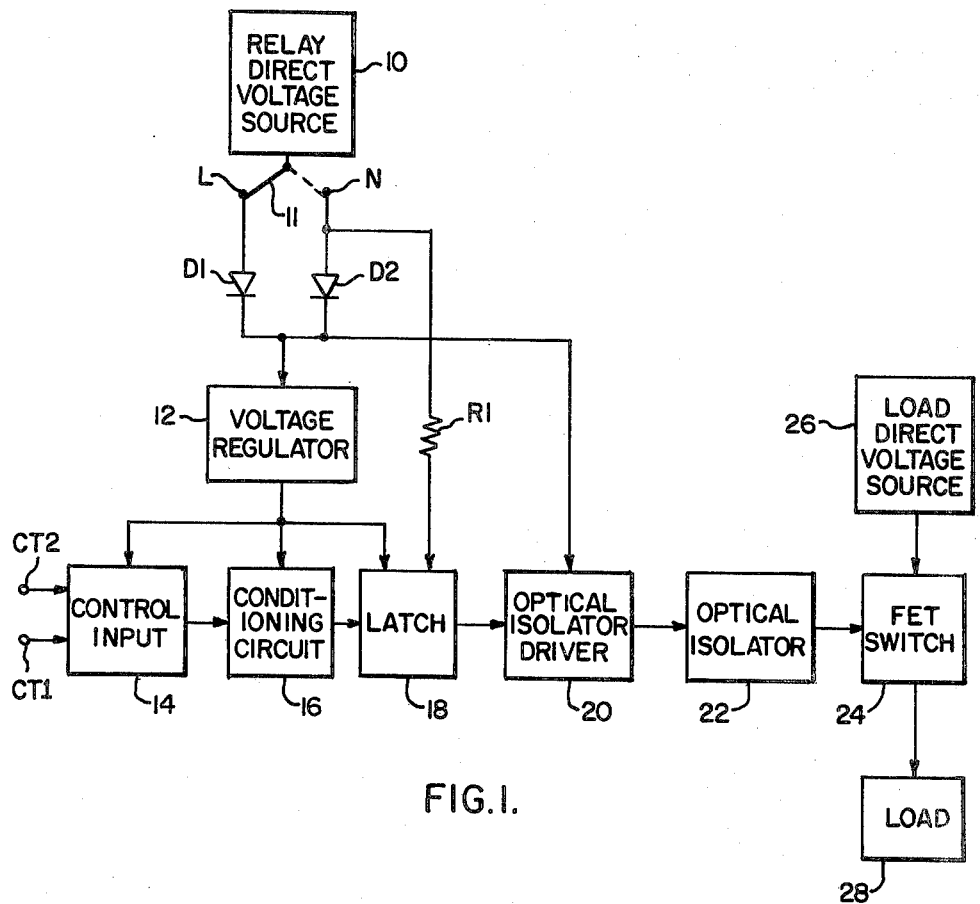
FIG. 1 is a functional block diagram showing the components of a solid state relay in accordance with an embodiment of the present invention.

Referring to the drawings, FIG. 1 shows a functional block diagram of a solid state relay in accordance with the present invention. Relay direct voltage source 10 is connected via switch 11 to functional terminal L or N. Connection to functional terminal L will cause the relay to operate in the latched mode, while connection to functional terminal N results in unlatched operation. Diodes D1 and D2 are connected between functional terminals L and N and voltage regulator 12 to provide power to the relay from the relay direct voltage source 10.

Voltage regulator 12 provides a stable supply voltage to the relay control input 14, conditioning 16 and latch 18 circuits. Two input terminals CT1 and CT2 are located on control input circuit 14 to illustrate that the relay can respond to a grounding signal or a positive voltage control signal. In this embodiment, grounding terminal CT2 or applying a positive voltage to terminal CT1 causes control input circuit 14 to change logic states from a high to a low. This causes a logic signal to pass through conditioning circuit 16 to latch circuit 18. If direct voltage source 10 is connected to functional terminal L, latch circuit 18 will shift to a particular logic state and supply a fixed signal to optical isolator driving circuit 20, thereby causing the optical isolators of isolator circuit 22 to remain in a fixed state and providing for latched relay operation. If direct voltage source 10 is connected to functional terminal N, a voltage signal supplied through resistor R1 provides means for overriding the latch circuit 18 so that no latching occurs and the signal supplied to optical isolator driving circuit 20 will change when the input control signal on terminal CT1 or CT2 changes. This provides unlatched relay operation.

The optical isolator driving circuit 20 contains a logic circuit which controls current to the optical isolators to ensure break-before-make operation. This is accomplished by momentarily turning off current to all optical isolators when the relay is changing state for a period longer than the worst case timing difference between turn-off and turn-on time of the FET's.

Field effect transistor switch circuit 24 responds to radiation produced by optical isolator circuit 22 by providing either a low or a high resistance path between load direct voltage source 26 and load 28, thereby simulating the on and off functions of a mechanical relay.

Figure 2:
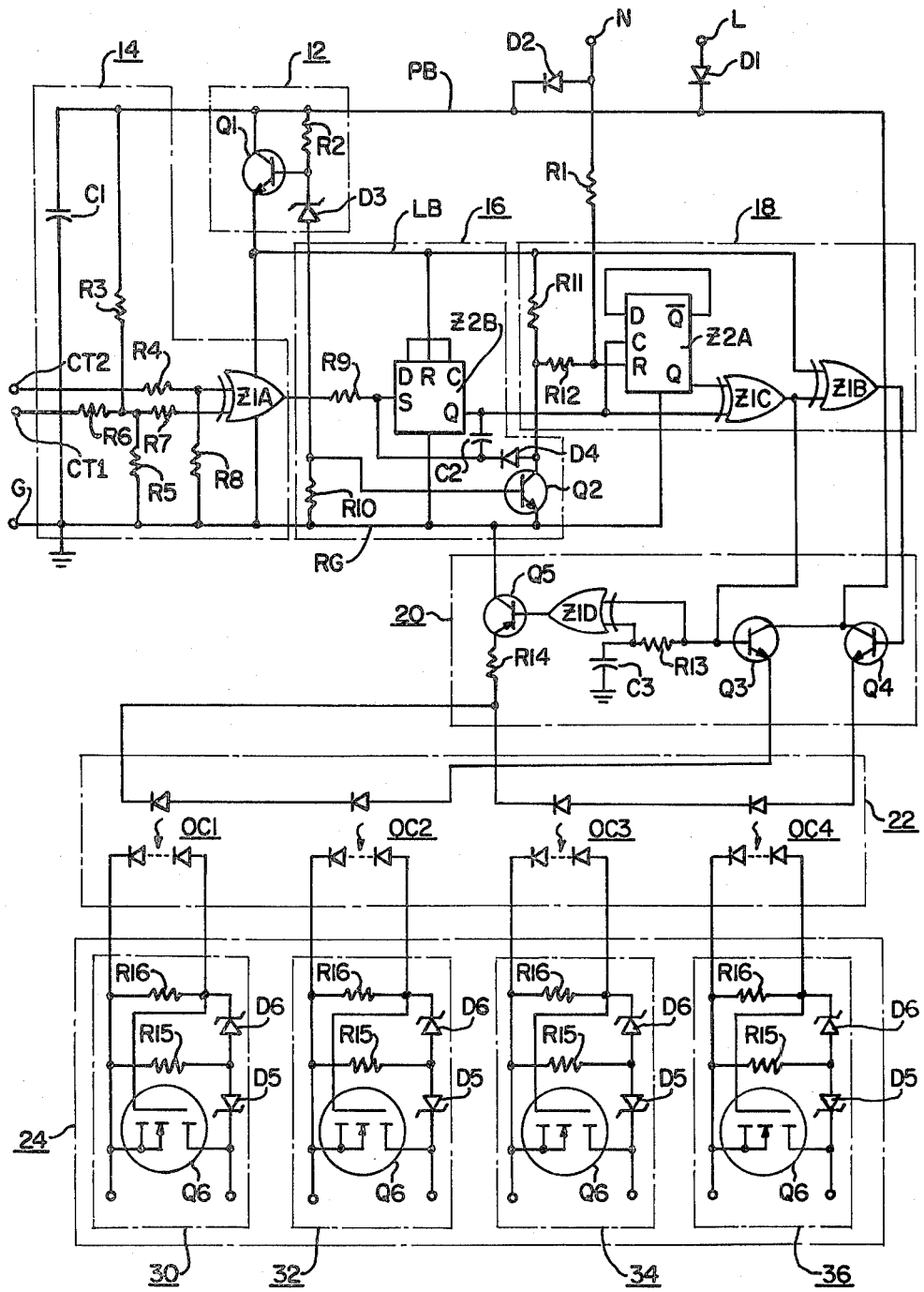
FIG. 2 is a schematic diagram of a solid state relay in accordance with an embodiment of the present invention.

FIG. 2 is a circuit schematic of a solid state relay in accordance with one embodiment of the present invention. A relay direct voltage source, not shown, is used to energize the solid state relay by supplying voltage to functional terminal L or N. Terminals L and N are connected to power bus PB through diodes D1 and D2 respectively. Voltage regulator circuit 12, comprising resistor R2, transistor Q1, and zener diode D3, is connected between power bus PB and relay ground RG and provides a regulated voltage to logic bus LB.

Control input circuit 14 serves as a voltage sensing means and comprises resistors R3, R4, R5, R6, R7 and R8, capacitor C1 and exclusive OR logic gate Z1A. This control input circuit 14 acts as a sensing means to respond to a grounding control signal between terminals CT2 and G or a positive voltage control signal between terminals CT1 and G. Capacitor C1 filters noise from the circuit and provides a low impedance source for transistor Q1 to prevent oscillation. The input circuit responds by changing the output of logic gate Z1A from a logic high to a logic low. This logic signal of a relatively fixed magnitude passes to conditioning circuit 16 which comprises resistors R9 and R10, capacitor C2, diode D4, transistor Q2, and flip-flop Z2B. The conditioning circuit provides a time delay and prevents noise from actuating the relay by providing positive feedback, via capacitor C2, to provide a clean logic signal to latch circuit 18. Since capacitor C2 is connected between the set terminal S and output Q of flip-flop Z2B, resistor R9 and capacitor C2 provide for a time delay in the operation of flip-flop Z2B.

Transistor Q2 serves to initialize the states of flip-flops Z2A and Z2B during start-up to ensure proper relay operation. When power is applied to the relay, transistor Q2 is initially off. Therefore a logic high signal is transmitted to reset terminal R of flip-flop Z2A via resistor R12 and to set terminal S of flip-flop Z2B via diode D4. When the applied voltage rises above the threshold voltage of Zener diode D3, transistor Q2 is turned on and remains on until power is removed from the relay.

Latch circuit 18 comprises resistors R11 and R12, flip-flop circuit Z2A, and logic gates Z1B and Z1C. The logic signal from conditioning circuit 16 is connected to one input of logic gate Z1C and also to the clock input C of flip-flop circuit Z2A. Output terminal Q of flip-flop Z2A is connected to a second input of logic gate Z1C.

If the relay direct voltage source, not shown, is connected to functional terminal L, then reset terminal R on flip-flop Z2A is maintained at a low level and flip-flop Z2A serves as means for generating a logic signal which changes state in response to the change in control logic signal from a logic low to a logic high at the output of conditioning circuit 16. If the relay direct voltage source is connected to functional terminal N, reset terminal R on flip-flop Z2A receives a high signal, continually resetting flip-flop Z2A. This continual resetting acts as means for overriding the latching function of flip-flop Z2A, causing it to perform as a noninverting buffer.

Logic gate Z1B acts as an inverter to provide a logic signal complementary to the output of logic gate Z1C. The logic signals on the output of gates Z1C and Z1B are connected to optical isolator driver circuit 20 which comprises transistors Q3, Q4 and Q5, resistors R13 and R14, capacitor C3, and exclusive OR gate Z1D. Transistors Q3 and Q4 are connected in series with branch circuits including light emitting diodes in optical coupler circuit 22, as well as resistor R14 and transistor Q5. When transistor Q5 is on, a positive logic signal supplied to the base of transistor Q3 will turn on transistor Q3, thereby turning on the light emitting diodes of optical couplers OC1 and OC2. Similarly, a positive logic signal supplied to the base of transistor Q4 will turn on transistor Q4, thereby turning on the light emitting diodes of optical couplers OC3 and OC4.

The break-before-make feature of this embodiment of the invention is provided by momentarily turning off transistor Q5 each time the relay switches. This turns off current through the light emitting diodes of all optical couplers for a period long enough to ensure that all field effect transistor switches turn off. For the purpose of illustrating the operation of transistor Q5, assume that the output of exclusive OR gate Z1C is initially low. Then capacitor C3 is at a low voltage and current is not flowing through resistor R13. Since both inputs to exclusive OR gate Z1D are low, the output of Z1D is low and transistor Q5 is on. When the output of exclusive OR gate Z1C changes from low to high, current begins to flow through resistor R13 to charge capacitor C4. The inputs to exclusive OR gate Z1D are logic complements until capacitor C3 charges to the logic high threshold of gate Z1D. During this charging time, the output of gate Z1D is high and transistor Q5 is off. Circuit parameters are chosen so that the output of gate Z1D remains high for a time longer than the worst case time difference between the field effect power transistor switch turn on and turn off times.

The light emitting diodes of optical couplers OC1, OC2, OC3, and OC4 are used to generate radiation which is transmitted to an array of photodiodes in each optical coupler. Each array of photodiodes typically comprises the series connection of thirty-two photodiodes. Radiation from an associated light emitting diode causes each photodiode array to generate a voltage to turn on a field effect transistor.

Each field effect transistor switching circuit 30, 32, 34 and 36 comprises resistors R15 and R16, zener diode D5 and D6 and field effect transistor Q6. The field effect transistors Q6, each contain a gate, drain, source and substrate electrode. A pair of output terminals are connected to the source and drain terminals of each field effect transistor. Resistor R16 is connected between the gate and substrate electrodes to provide means for draining the charge on the FET gate, thereby causing the FET to turn off. If the circuit in FIG. 2 receives power at terminal N, grounding terminal CT2 or supplying a positive signal to terminal CT1 will actuate the relay stopping current flow in optical couplers OC1 and OC2 and causing current to flow in optical couplers OC3 and OC4. This turns off FET switching circuits 30 and 32 and turns on circuits 34 and 36. Removing the control signal causes circuits 30 and 32 to turn on while circuits 34 and 36 turn off. Therefore the terminals of circuits 30 and 32 represent normally closed contacts while the terminals of circuits 34 and 36 represent normally open contacts.

If power is applied to the relay at terminal L, flip-flop Z2 changes state each time the control signal is removed, causing both inputs of gate Z1C to change at the same time. Therefore the output of gate Z1C does not change and the relay stays latched.

Each FET switching circuit 30, 32, 34 and 36 is provided with a transient protection circuit which clamps inductive voltage spikes to protect FET Q6. If a voltage spike appears on the output terminals of an FET switching circuit, Zener diode D5 will clamp the spike at 82 volts and pass current to the associated optical coupler diode array. This creates a gate voltage which turns on the FET and clamps the voltage spike to less than 90 volts. Zener diode D6 prevents the forward biasing of Zener diode D5 when the FET is turned on during normal operation and also clamps the gate to source voltage. Turn off time of the FET switch includes time for the gate circuit to discharge to the FET threshold of three to four volts. By limiting gate voltage, turn off time is shortened so that it approaches turn on time. Resistor R15 provides a path for leakage current through diode D7 to ensure that FET Q6 is not unintentionally switched on.

The following table of components is provided as a more complete exemplary embodiment of the invention in connection with the circuitry illustrated in FIG. 2.

TABLE OF COMPONENTS

| INTEGRATED CIRCUITS | |
|---|---|
| Z1 | MC14070B |
| Z2 | MC14013B |
| RESISTORS | |
| R1 | 100K |
| R2 | 5.6K |
| R3 | 10K |
| R4 | 160K |
| R5 | 5.4K |
| R6 | 4.3K |
| R7 | 200K |
| R8 | 200K |
| R9 | 470K |
| R10 | 50K |
| R11 | 10K |
| R12 | 100K |
| R13 | 470K |
| R14 | 510Ω |
| R15 | 10K |
| R16 | 10 Meg |
| CAPACITORS | |
| C1 | .001 µf |
| C2 | .047 µf |
| C3 | 0.1 µf |
| DIODES | |
| D1 | 1N486B |
| D2 | 1N486B |
| D3 | 9.4V Zener |
| D4 | 1N486B |
| D5 | 82V Zener |
| D6 | 82V Zener |
| TRANSISTORS | |
| Q1 | 2N3501 |
| Q2 | 2N2219A |
| Q3 | 2N3501 |
| Q4 | 2N3501 |
| Q5 | 2N2907 |
| Q6 | IRF530 |
| OPTICAL COUPLERS | |
| OC1 | DIG-2 |
| OC2 | DIG-2 |
| OC3 | DIG-2 |
| OC4 | DIG-2 |

Using the component values listed in the table, a circuit was constructed having four, isolated, one amp contacts and meeting the following specifications:

Control Noise Immunity: 10 msec. Minimum
Total Operation Time: 100 msec. Maximum
Rise and Fall Time (10 to 90%): 3 to 20 msec.
Operating Voltage: 16 to 30 VDC While a preferred embodiment of this invention has been described, the specific circuitry employed may be varied in relation to particular applications without departing from the scope of the invention.

What is claimed is:

1. A solid state relay comprising:
   sensing means for responding to an input voltage signal by producing a logic signal of a relatively fixed magnitude;
   a logic gate having a first input terminal operatively connected to receive said logic signal from said sensing means, an output, and having a second input terminal;
   said second input terminal having a fixed interconnection to means for generating a first signal changing in logic state only upon a predetermined change in the waveform of said logic signal from said sensing means;
   means for selectively overriding said first signal connected to said second input terminal with an externally available function terminal;
   said function terminal requiring no connection for an output signal from said logic gate to provide latching type operation of the relay;
   at least two light emitting diodes responsive to said logic signal, appearing at said output, for generating radiation;
   at least two arrays of photodiodes each connected in series between a pair of array electrodes and operatively coupled to said light emitting diodes for developing a control voltage across said array electrodes in response to radiation from said light emitting diode;
   at least two field effect transistors each including a pair of current carrying electrodes, a gate electrode and a substrate electrode, one of said array electrodes connected to said gate electrode and the other of said array electrodes connected to said substrate electrode whereby the impedance between said current carrying electrodes has one value in the absence of and a greatly different value in the presence of said control voltage between said gate electrode and said substrate electrode;
   means for providing a large resistive impedance between said gate electrode and said substrate electrode of each of said field effect transistors;
   a pluraltiy of output terminals, each connected to a respective one of said current carrying electrodes; and
   means for momentarily turning off said light emitting diodes in response to a change in said logic signal, appearing at said output said light emitting diodes remaining in the off condition for a time period longer than the worst case difference between the turn off time and the turn on time of said field effect transistors.

2. A solid state relay as recited in claim 1, wherein said means for turning off said light emitting diodes comprises:
   a transistor switch connected in series between said light emitting diodes and ground;
   a branch circuit connected between the output of said logic gate and ground;

said branch circuit including the series connection of a resistor and a capacitor;

an exclusive OR logic gate having inputs connected to each side of said resistor and having an output connected to the base of said transistor switch.

3. A solid state relay as recited in claim 1, further comprising:

means for limiting voltage between said gate electrode and said substrate electrode of each of said field effect transistors.

4. A solid state relay as recited in claim 3, wherein said means for limiting voltage is a Zener diode.

5. A solid state relay as recited in claim 1, wherein said means for generating said first signal comprises a flip-flop circuit operatively connected to receive said logic signal.

6. A solid state relay as recited in claim 5, wherein said function terminal is connected to a reset input on said flip-flop circuit.

7. A solid state relay as recited in claim 5, further comprising means for conditioning said logic signal, connected between said sensing means and said logic gate.

8. A solid state relay as recited in claim 7, wherein said means for conditioning comprises:

a second flip-flop having an input connection and an output connection;

a resistor having one end connected to said second flip-flop input connection; and a capacitor connected between said input and said output connections of said second flip-flop;

said logic signal being connected to a second end of said resistor.

9. A solid state relay as recited in claim 1 further comprising means for suppressing voltage spikes on said current carrying electrodes.

10. A solid state relay as recited in claim 9 wherein said means for suppressing voltage spikes comprises:

a circuit branch connected between said gate electrode and one of said current carrying electrodes of each of said field effect transistors;

said circuit branch including the series connection of two Zener diodes; and a resistor having one end connected to the common point between said diodes and a second end connected to the other current carrying electrode.

* * * * *